(12) United States Patent
Lee et al.

(10) Patent No.: US 9,087,837 B2
(45) Date of Patent: Jul. 21, 2015

(54) SEMICONDUCTOR PACKAGE AND METHOD OF MANUFACTURING THE SAME

(75) Inventors: Doo Hwan Lee, Gyunggi-do (KR); Tae Sung Jeong, Gyunggi-do (KR); Yul Kyo Chung, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/572,833

(22) Filed: Aug. 13, 2012

(65) Prior Publication Data
US 2013/0320516 A1  Dec. 5, 2013

(30) Foreign Application Priority Data
May 31, 2012 (KR) .................. 10-2012-0058493

(51) Int. Cl.
| | |
|---|---|
| H01L 23/28 | (2006.01) |
| H01L 21/52 | (2006.01) |
| H01L 23/00 | (2006.01) |
| H01L 23/31 | (2006.01) |
| H01L 21/56 | (2006.01) |
| H01L 23/538 | (2006.01) |
| H01L 21/768 | (2006.01) |
| H01L 23/544 | (2006.01) |
| H01L 21/54 | (2006.01) |
| H01L 21/78 | (2006.01) |

(52) U.S. Cl.
CPC ............. *H01L 21/52* (2013.01); *H01L 21/54* (2013.01); *H01L 21/561* (2013.01); *H01L 21/76802* (2013.01); *H01L 21/76877* (2013.01); *H01L 21/78* (2013.01); *H01L 23/3107* (2013.01); *H01L 23/3121* (2013.01); *H01L 23/3128* (2013.01); *H01L 23/5389* (2013.01); *H01L 23/544* (2013.01); *H01L 23/562* (2013.01); *H01L 24/19* (2013.01); *H01L 24/20* (2013.01); *H01L 24/97* (2013.01); *H01L 24/83* (2013.01); *H01L 24/92* (2013.01); *H01L 2223/54426* (2013.01); *H01L 2223/54486* (2013.01); *H01L 2224/2919* (2013.01); *H01L 2224/32225* (2013.01); *H01L 2224/73267* (2013.01); *H01L 2224/83191* (2013.01); *H01L 2224/83192* (2013.01); *H01L 2224/92244* (2013.01); *H01L 2224/97* (2013.01); *H01L 2924/15153* (2013.01)

(58) Field of Classification Search
CPC .............. H01L 2924/15311; H01L 2224/97; H01L 2224/16225; H01L 23/49816; H01L 2224/73253; H01L 24/81; H01L 2924/18161; H01L 2924/19105; H01L 2224/16235
USPC .......... 257/698, 700, 701, 781, 778, 787, 790
See application file for complete search history.

(56) References Cited

U.S. PATENT DOCUMENTS

| | | | |
|---|---|---|---|
| 5,879,964 A | 3/1999 | Paik et al. | |
| 5,945,741 A * | 8/1999 | Ohsawa et al. | 257/777 |
| 6,114,755 A * | 9/2000 | Ito et al. | 257/675 |

(Continued)

*Primary Examiner* — Sheila V Clark
(74) *Attorney, Agent, or Firm* — Ladas & Parry, LLP

(57) ABSTRACT

Disclosed herein are a semiconductor package and a method of manufacturing the same, the semiconductor package including: a molding member having a cavity formed therein; a device mounted in the cavity; an insulating member formed inside the cavity and on and/or beneath the molding member and the device; a circuit layer formed on the insulating member, and including vias and connection pads electrically connected with the device; a solder resist layer formed on the circuit layer, and having openings exposing upper portions of the connection pads; and solder balls formed in the openings.

8 Claims, 7 Drawing Sheets

(56) References Cited

U.S. PATENT DOCUMENTS

| | | | |
|---|---|---|---|
| 8,410,614 B2 * | 4/2013 | Kunimoto | 257/774 |
| 2008/0206926 A1 * | 8/2008 | Sakamoto et al. | 438/110 |
| 2008/0277783 A1 * | 11/2008 | Kim et al. | 257/737 |
| 2010/0025848 A1 * | 2/2010 | Beer et al. | 257/738 |
| 2011/0193203 A1 * | 8/2011 | Goto et al. | 257/659 |
| 2011/0281405 A1 * | 11/2011 | Beer et al. | 438/127 |
| 2012/0170240 A1 * | 7/2012 | Tanaka | 361/783 |
| 2013/0059420 A1 * | 3/2013 | Goto et al. | 438/121 |

\* cited by examiner

SEMICONDUCTOR PACKAGE AND METHOD OF MANUFACTURING THE SAME

CROSS REFERENCE TO RELATED APPLICATION

This application claims the benefit of Korean Patent Application No. 10-2012-0058493, filed on May 31, 2012, entitled "Semiconductor Package and Method for Manufacturing the Semiconductor Package", which is hereby incorporated by reference in its entirety into this application.

BACKGROUND OF THE INVENTION

1. Technical Field

The present invention relates to a semiconductor package and a method of manufacturing the same.

2. Description of the Related Art

With the technical progress of semiconductor devices integrated on a large-scale and miniaturized, assembling technologies for manufacturing semiconductor packages have been greatly developed. In addition, as portable electronic device markets expand all over the world, miniaturization and lightness thereof have been rapidly promoted. Therefore, several types of semiconductor package methods have been developed in order to implement fine pitch, miniaturization, and slimness thereof (U.S. Pat. No. 5,879,964). However, as for the semiconductor package of the prior art, a heat treatment may be performed in order to cure a mold after the mold is formed on a device. Here, after the mold is cured, a heat treatment for reflow may be further performed in forming external connection terminals such as solder balls. While heat treatment is performed several times as described above, a warpage phenomenon may be generated due to a difference in coefficient of thermal expansion between the device and the mold.

SUMMARY OF THE INVENTION

The present invention has been made in an effort to provide a semiconductor package and a method of manufacturing the same, capable of preventing a warpage phenomenon from being generated due to a difference in coefficient of thermal expansion between the device and the mold.

Further, the present invention has been made in an effort to provide a semiconductor package and a method of manufacturing the same, capable of protecting a device from physical impact applied from the outside.

Further, the present invention has been made in an effort to provide a semiconductor package and a method of manufacturing the same, capable of reducing a thickness thereof by polishing a lower portion of a molding member.

Further, the present invention has been made in an effort to provide a semiconductor package and a method of manufacturing the same, capable of packaging a device having electrodes formed on both surfaces thereof.

According to a preferred embodiment of the present invention, there is provided a semiconductor package, including: a molding member having a cavity formed therein; a device mounted in the cavity; an insulating member formed inside the cavity and on and/or beneath the molding member and the device; a circuit layer formed on the insulating member, and including vias and connection pads electrically connected with the device; a solder resist layer formed on the circuit layer, and having openings exposing upper portions of the connection pads; and solder balls formed in the openings.

The cavity may have a larger width than the device.

The cavity may have a higher height than the device.

The semiconductor package may further include an adhesive coated on a lower surface of the device.

The molding member may be formed of an epoxy resin.

The molding member may include a filler.

The filler may be at least one of alumina and silica.

Here, a lower surface of the device may be exposed to a lower portion of the molding member.

According to another preferred embodiment of the present invention, there is provided a method of manufacturing a semiconductor package, the method including: preparing a mold having cavity forming patterns formed thereon; forming a molding member on the mold; removing the mold from the molding member to thereby form cavities in the molding member; mounting devices in the cavities of the molding member; forming an insulating member on the molding member and the devices; forming a circuit layer on the insulating member, the circuit layer including vias and connection pads; forming a solder resist layer on the circuit layer, the solder resist layer having openings exposing upper portions of the connection pads; and forming solder balls in the openings.

Here, in the preparing of the mold, the cavity forming pattern may have a larger width than the device.

Here, in the preparing of the mold, the cavity forming pattern may have a higher height than the device.

Here, in the preparing of the mold, a fiducial mark may be further formed on one side or both sides of the mold.

The fiducial mark may be transferred to the molding member when the mold is removed.

The mold may further include a pattern for a fiducial mark insertion groove on one side or both sides thereof, and the mold may be removed from the molding member to thereby form a fiducial mark insertion groove in the molding member.

Here, in the forming of the molding member, the molding member may be filled on the mold.

Here, in the forming of the molding member, the mold may be pressed on the molding member.

The method may further include, before the mounting of the devices in the cavities, coating an adhesive on bottom surfaces of the cavities.

The method may further include, after the forming of the molding member, mounting a fiducial mark in the fiducial mark insertion groove.

Here, in the forming of the molding member, the insulating member may be filled inside the cavities.

The forming of the circuit layer may include: forming via holes in the insulating member on the devices; filling the via holes with a conductive material to thereby form the vias; and forming the connection pads on the insulating member and the vias by using a conductive material.

The method may further include, after the mounting of the devices in the cavities, polishing a lower portion of the molding member.

Here, in the polishing of the lower portion of the molding member, the lower portion of the molding member may be polished to expose the devices.

The method may further include, after the forming of the insulating member on the molding member and the devices, polishing a lower portion of the molding member.

Here, in the polishing of the lower portion of the molding member, the lower portion of the molding member may be polished to expose the devices.

The insulating member may be formed beneath the molding member, before the forming of the circuit layer.

Here, in the forming of the circuit layer, the circuit layer may be formed on the insulating member formed beneath the molding member.

The circuit layer may be electrically connected with the devices.

The circuit layer may further include penetration vias penetrating through the insulating member formed on and beneath the molding member and the molding member.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
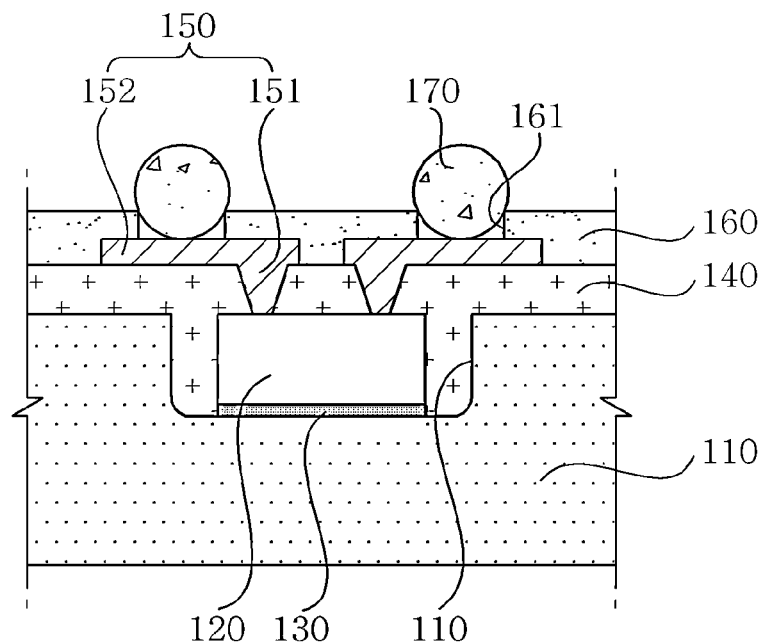
FIG. 1 is an exemplified view showing a semiconductor package according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is an exemplified view showing a semiconductor package according to a preferred embodiment of the present invention.

Referring to FIG. 1, a semiconductor package 100 may include a molding member 110, a device 120, an insulating member 140, a circuit layer 150, a solder resist layer 160, and external connectors 170.

The molding member 110 may include a cavity 111 in which the device 120 is mounted. The cavity 111 of the molding member 110 may be larger than the device 120 to be mounted. For example, the cavity 111 may have a larger width than the device 120. Also, the cavity 111 may have a higher height than the device 120. The molding member 110 may be formed of an epoxy molding compound (EMC), other resins, or the like. Also, the molding member 110 may include a filler in the EMC, resin, or the like. The filler may be a material having excellent heat conductivity, such as, silica ($SiO_2$), alumina ($Al_2O_3$), boron nitride (BN), or the like.

The device 120 may be inserted and mounted in the cavity 111 formed in the molding member 110. The device 120 may include a circuit, and may be an electronic device, such as, a semiconductor chip or the like for performing specific functions. When the device 120 is mounted in the cavity 111, an adhesive 130 may be used to improve an adhesive strength between the device 120 and the molding member 110. The adhesive 130 may be coated on a lower surface of the device 120. Alternatively, the adhesive 130 may be coated on a bottom surface of the cavity 111 in which the device 120 is to be mounted. The adhesive 130 may be formed of a known material.

The insulating member 140 may be formed on the molding member 110 and the device 120. In addition, the insulating member 140 may be formed in a separation space between the device 120 and an inside of the cavity 111. The insulating member 140 formed as above may serve to protect the device 120 by buffering physical impact applied from an outside of the molding member 110. The insulating member 140 may be formed of an insulating material, such as, polyimide, resin, photo resist, prepreg, or the like.

The circuit layer 150 may be formed inside or outside the insulating member 140. The circuit layer 150 may be electrically connected with the device 120. The circuit layer 150 may be formed of a conductive material. The circuit layer 150 may include vias 151 and connection pads 152. The vias 151 may be formed inside the insulating member 140. The connection pads 152 may be formed on the insulating member 140. The vias 151 may be electrically connected with the device 120 and the connection pads 152. The connection pads 152 may be electrically connected with an external equipment (not shown). The device 120 positioned inside the molding member 110 may be electrically connected with the external equipment (not shown) by the circuit layer 150 formed as above.

The solder resist layer 160 may be formed on the circuit layer 150 and the insulating member 140. The solder resist layer 160 may include openings 161 for exposing upper portions of the connection pads 152, respectively.

The external connectors 170 may be formed on the connection pads 152 exposed to the outside through the openings 161 of the solder resist layer 160. The external connectors 170 may be electrically connected with the connection pads 152. In addition, the external connectors 170 may be electrically connected with the external equipment (not shown) such as a surface mount component. For example, the external connector 170 may be a solder ball or the like.

Although not shown in the preferred embodiment of the present invention, a surface treatment layer may be formed on the connection pads 152. The surface treatment layer may include at least one of gold (Au), OSP, palladium (Pd), and nickel (Ni).

FIGS. 2 to 9 are exemplified views showing a method of manufacturing a semiconductor package according to a preferred embodiment of the present invention.

Figure 2:
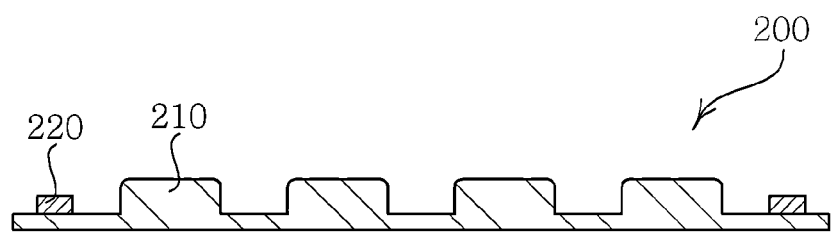
FIGS. 2 to 9 are exemplified views showing a method of manufacturing a semiconductor package according to a preferred embodiment of the present invention.

Referring to FIG. 2, a mold 200 may be prepared. The mold 200 is for forming cavities in which devices 120 are to be mounted, respectively. Cavity forming patterns 210 may be formed on the mold 200. The cavity forming patterns 210 may be embossed in order to form cavities 111 in a molding member 110. Here, the cavity forming patterns 210 may be one or more in number. The cavity forming pattern 210 may have a larger width than the device 120 to be mounted in the cavity 111. The cavity forming pattern 210 may have a larger width than the device 120 to be mounted in the cavity 111. As described above, the width and height of the cavity 111, which is to be formed in the molding member 110 by the cavity forming pattern 210 formed on the mold 200, may be larger than the width of the device 120 and be higher than the height thereof.

In addition, according to the preferred embodiment of the present invention, a fiducial mark 220 may be formed on one side or both sides of the mold 200. The fiducial mark 220 may be a reference point for determining an accurate position when the device 120 is mounted in the cavity 111 of the molding member 110.

The mold 200 may be formed of plastic or metal. In addition, the mold 200 may be formed of a material having strong heat resistance in the high-temperature environment for curing the molding member 110.

Figure 3:
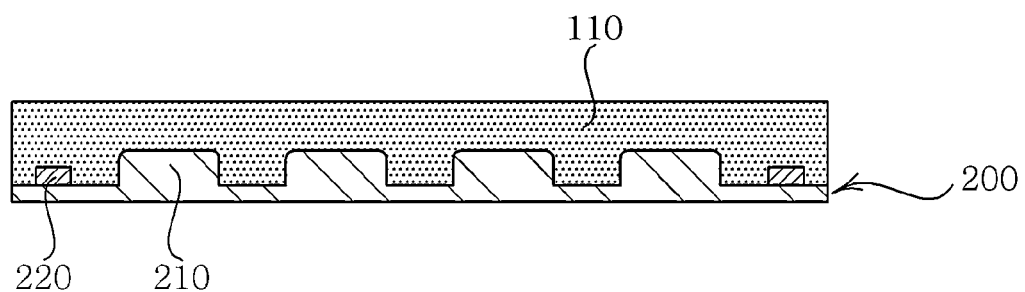

Referring to FIG. 3, the molding member 110 may be formed on the mold 200. The molding member 110 may be formed on the mold 200 in a printing manner. In addition, the molding member 110 may be formed in a type like a sheet, and the mold 200 is pressed on the molding member 110, so that the molding member 110 as shown in FIG. 3 may be formed.

The molding member 110 may be formed of an epoxy molding compound (EMC), other resins, or the like. Also, the molding member 110 may include a filler in the EMC, resin, or the like. The filler may be a material having excellent heat conductivity, such as, silica ($SiO_2$), alumina ($Al_2O_3$), boron nitride (BN), or the like. After the molding member 110 is formed on the mold 200 as described above, curing may be performed. As described above, the molding member 110 may be cured before the devices 120 are mounted in the molding member 110. Therefore, a warpage phenomenon generated due to a difference in coefficient of thermal expansion between the device 120 and the molding member 110 can be prevented, which is caused by forming the device 120 in the molding member 110 and then performing curing.

Figure 4:
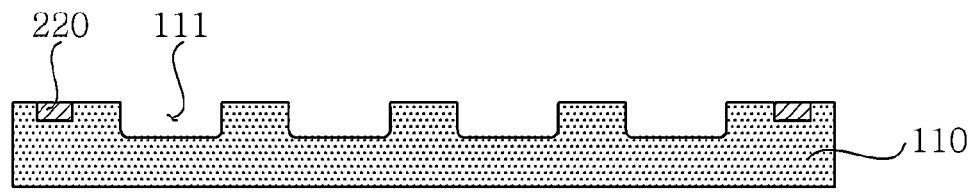

Referring to FIG. 4, the mold 200 may be removed from the molding member 110. As such, the mold 200 is removed from the molding member 110, so that the molding member 110 has cavities 111 formed therein. That is, the cavities 111 for respectively mounting the devices 120 therein may be formed in the molding member 110 in which the cavity forming patterns 210 of the mold 200 are buried. Here, since the width of the cavity forming pattern 210 of the mold 200 is larger than the width of the device 120, the cavity 111 may also have a larger width than the device 120. In addition, since the height of the cavity forming pattern 210 of the mold 200 is higher than the height of the device 120, the height of the cavity 111 is also higher than the height of the device 120.

In addition, when the mold 200 is removed from the molding member 110, the fiducial mark 220 formed on the mold 200 may be transferred to the molding member 110.

Figure 5:
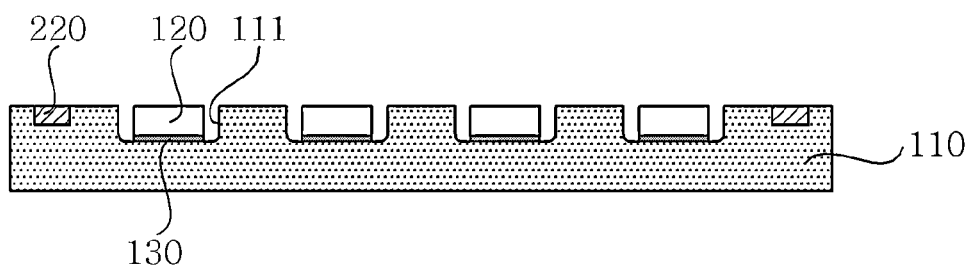

Referring to FIG. 5, the devices 120 may be mounted in the molding member 110. The device 120 may include a circuit, and may be an electronic device, such as, a semiconductor chip or the like for performing specific functions. The devices 120 may be inserted and mounted in the cavities 111 formed in the molding material 110, respectively. Here, since the width of the cavity 111 is larger than the width of the device 120, a separation space may be formed between both side surfaces of the inserted device 120 and both side walls of the cavity 111. In addition, since the height of the cavity 111 is higher than the height of the device 120, an upper surface of the inserted device 120 is positioned below an upper surface of the cavity 111.

In addition, an adhesive 130 may be coated on lower surfaces of the devices 120 or bottom surfaces of the cavities 111 of the molding member 110. The devices 120 may be more reliably fixed into the cavities 111 of the molding member 110 by the coated adhesive 130.

Figure 6:
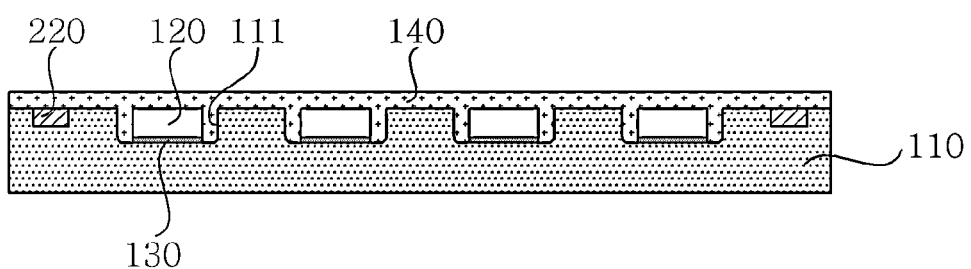

Referring to FIG. 6, the insulating member 140 may be formed on the molding member 110 in which the devices 120 are mounted. The insulating member 140 may fill the separation space between the cavity 111 and the device 120 mounted in the cavity 111. In addition, the insulating member 140 may be formed on the molding member 110 and the devices 120. The insulating member 140 may be formed of an insulating material, such as, polyimide, resin, photo resist, prepreg, or the like. The cavity 111 is larger than the device 120, so that the separation space is formed therebetween, and the insulating member 140 may fill the separation space. As such, the insulating member 140 formed in the separation space may buffer impact applied from the outside, to thereby serve to protect the device 120 mounted in the cavity 111 from the impact.

Figure 7:
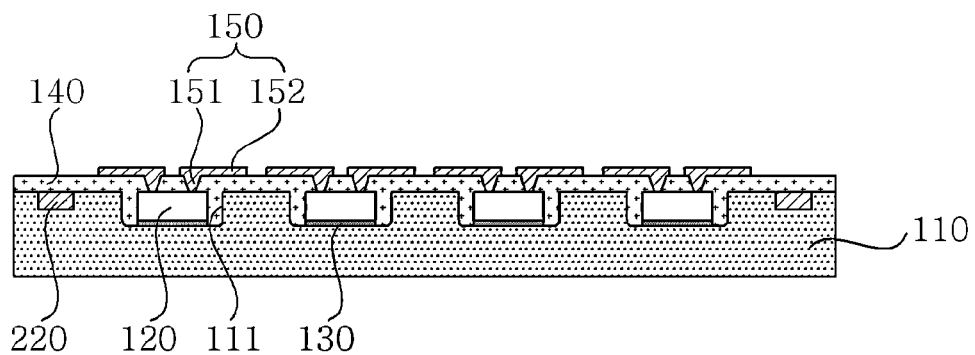

Referring to FIG. 7, a circuit layer 150 may be formed. The circuit layer 150 may be electrically connected with the device 120. The circuit layer 150 may include vias 151 and connection pads 152. The via holes may be formed in the insulating member 140 to expose upper portions of the devices 120. The via holes may be formed by a general via hole processing method, such as, exposing, laser processing, drill processing, or processing by chemicals. Here, the exposed upper portions of the devices 120 may be electrodes or the like, which an electric signal is inputted to or outputted from. After the via holes are formed, the vias 151 may be formed by filling the via holes with a conductive material. In addition, the connection pads 152 may be formed on the insulating member 140 such that the connection pads 152 are electrically connected with the vias 151. The connection pads 152 may be also formed of an insulating material. The vias 151 and the connection pads 152 may be formed by a general circuit forming method, such as, sputtering, electroless plating, electroplating, paste coating, or the like. The devices 120 and the connection pads 152 may be electrically connected with each other by the vias 151 formed as above.

Figure 8:
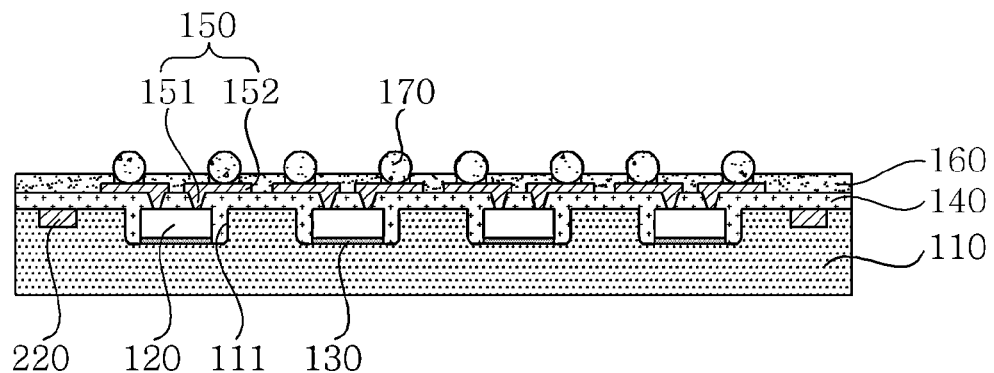

Referring to FIG. 8, a solder resist layer 160 and external connectors 170 may be formed. The solder resist layer 160 may be formed on the insulating member 140 and the circuit layer 150. Here, the solder resist layer 160 may include openings 161 for exposing upper portions of the connection pads 152. After the solder resist layer 160 is formed, the external connectors 170 may be formed on the upper portions of the connection pads 152, which are exposed through the openings 161. Here, the external connector 170 may be a solder ball or the like.

Figure 9:
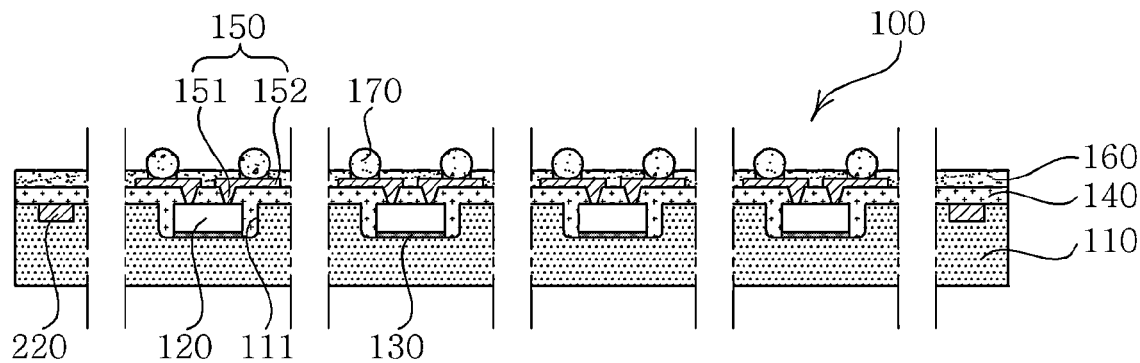

Referring to FIG. 9, unit-level semiconductor packages 100 may be separated from each other by cutting between the devices 120 mounted in the cavities 111. The preferred embodiment of the present invention may include a process of separating unit-level semiconductor packages 100 from each other since a plurality of devices 120 are simultaneously packaged. However, in the case where one device 120 is packaged, the process of separating unit-level semiconductor packages 100 from each other may be skipped.

FIGS. 10 to 17 are exemplified views showing a method of manufacturing a semiconductor package according to a preferred embodiment of the present invention.

Figure 10:
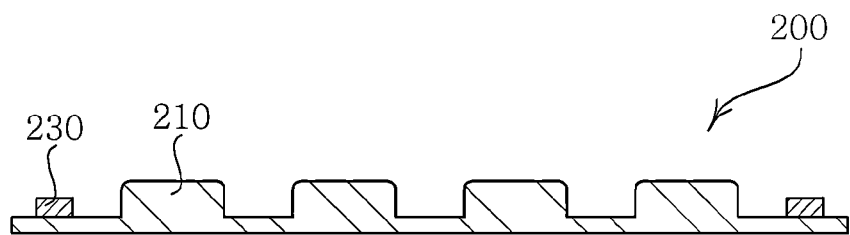
FIGS. 10 to 17 are exemplified views showing a method of manufacturing a semiconductor package according to a preferred embodiment of the present invention.

Referring to FIG. 10, a mold 200 may be prepared. The mold 200 is for forming cavities in which devices 120 are to be mounted. Cavity forming patterns 210 may be formed on the mold 200. The cavity forming patterns 210 may be embossed in order to form cavities 111 in a molding member 110. Here, the cavity forming patterns 210 may be one or more in number. The cavity forming pattern 210 may have a larger width than the device 120 to be mounted in the cavity 111. The cavity forming pattern 210 may have a larger width than the device 120 to be mounted in the cavity 111. As described above, the width and height of the cavity 111, which is to be formed in the molding member 110 by the cavity forming pattern 210 formed on the mold 200, may be larger than the width of the device 120 and be higher than the height thereof.

In addition, according to the preferred embodiment of the present invention, a pattern 230 for a fiducial mark inserting groove may be formed on one side or both sides of the mold 200. The pattern 230 for a fiducial mark inserting groove may be used to form a groove for inserting a fiducial mark 220 thereinto in the molding member 110. The pattern 230 for a fiducial mark inserting groove may be embossed.

The mold 200 may be formed of plastic or metal. In addition, the mold 200 may be formed of a material having strong heat resistance in the high-temperature environment for curing the molding member 110.

Figure 11:
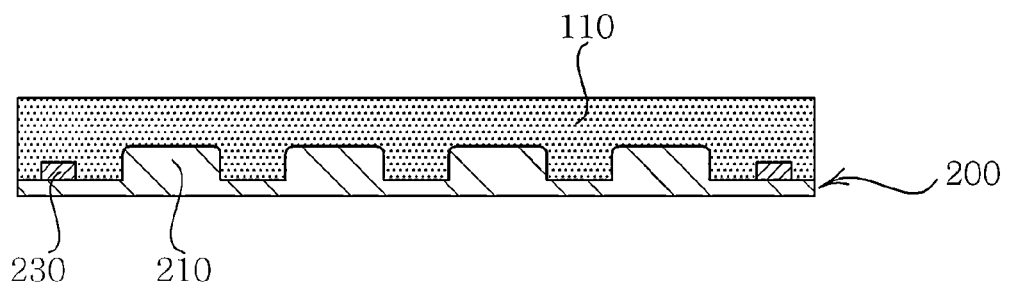

Referring to FIG. 11, the molding member 110 may be formed on the mold 200. The molding member 110 may be formed on the mold 200 in a printing manner. In addition, the molding member 110 may be formed in a type like a sheet, and the mold 200 is pressed on the molding member 110, so that the molding member 110 as shown in FIG. 11 may be formed.

The molding member 110 may be formed of an epoxy molding compound (EMC), other resins, or the like. Also, the molding member 110 may include a filler in the EMC, resin, or the like. The filler may be a material having excellent heat conductivity, such as, silica ($SiO_2$), alumina ($Al_2O_3$), boron nitride (BN), or the like. After the molding member 110 is formed on the mold 200 as described above, curing may be performed. As described above, the molding member 110 may be cured before the devices 120 are mounted in the molding member 110. Therefore, a warpage phenomenon generated due to a difference in coefficient of thermal expansion between the device 120 and the molding member 110 can be prevented, which is caused by forming the device 120 in the molding member 110 and then performing curing.

Figure 12:
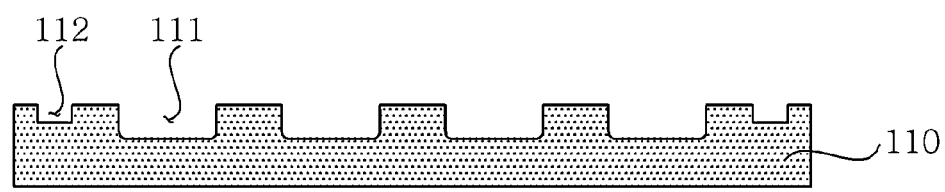

Referring to FIG. 12, the mold 200 may be removed from the molding member 110. As such, the mold 200 is removed from the molding member 110, so that the molding member 110 have cavities 111 formed therein. That is, the cavities 111 for respectively mounting the devices 120 therein may be formed in the molding member 110 in which the cavity forming patterns 210 of the mold 200 are buried. Here, since the width of the cavity forming pattern 210 of the mold 200 is larger than the width of the device 120, the width of the cavity 111 is also larger than the width of the device 120. In addition, since the height of the cavity forming pattern 210 of the mold 200 is higher than the height of the device 120, the height of the cavity 111 is also higher than the height of the device 120.

In addition, when the mold 200 is removed from the molding member 110, the fiducial mark insertion groove 112 may also be formed.

Figure 13:
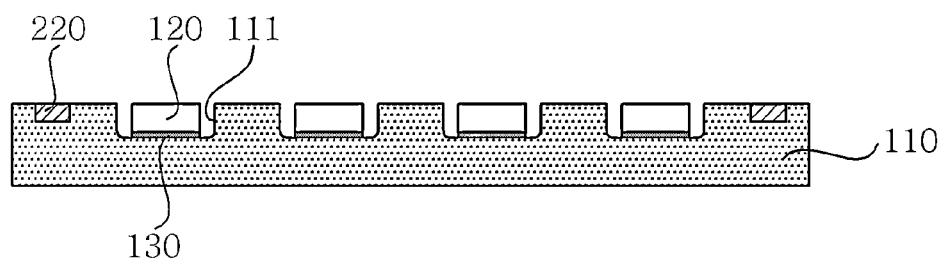

Referring to FIG. 13, the devices 120 may be mounted in the molding member 110. The device 120 may include a circuit, and may be an electronic device, such as, a semiconductor chip or the like for performing specific functions. The devices 120 may be inserted and mounted in the cavities 111 formed in the molding material 110, respectively. Here, since the width of the cavity 111 is larger than the width of the device 120, a separation space may be formed between both side surfaces of the inserted device 120 and both side walls of the cavity 111. In addition, since the height of the cavity 111 is higher than the height of the device 120, an upper surface of the inserted device 120 is positioned below an upper surface of the cavity 111.

In addition, an adhesive 130 may be coated on lower surfaces of the devices 120 or bottom surfaces of the cavities 111 of the molding member 110. The devices 120 may be more reliably fixed into the cavities 111 of the molding member 110 by the coated adhesive 130.

In addition, the fiducial mark 220 may be mounted in the fiducial mark insertion groove 112. The fiducial mark 220 may be a reference point for determining an accurate position when the device 120 is mounted in the cavity 111 of the molding member 110.

Figure 14:
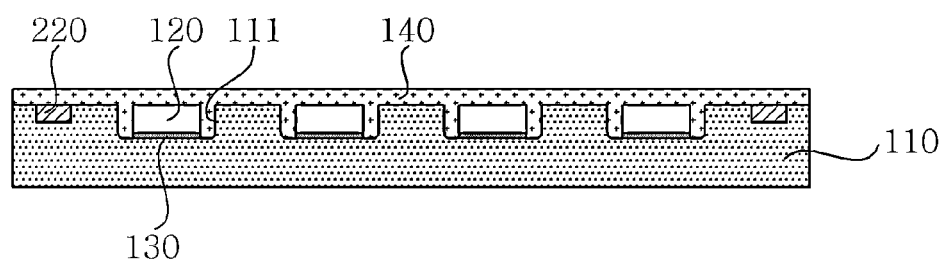

Referring to FIG. 14, the insulating member 140 may be formed on the molding member 110 in which the devices 120 are mounted. The insulating member 140 may fill the separation space between the cavity 111 and the device 120 mounted in the cavity 111. In addition, the insulating member 140 may be formed on the molding member 110 and the devices 120. The insulating member 140 may be formed of an insulating material, such as, polyimide, resin, photo resist, prepreg, or the like. The cavity 111 is larger than the device 120, so that the separation space is formed therebetween, and the insulating member 140 may fill the separation space. As such, the insulating member 140 formed in the separation space may buffer impact applied from the outside, to thereby serve to protect the device 120 mounted in the cavity 111 from the impact.

Figure 15:
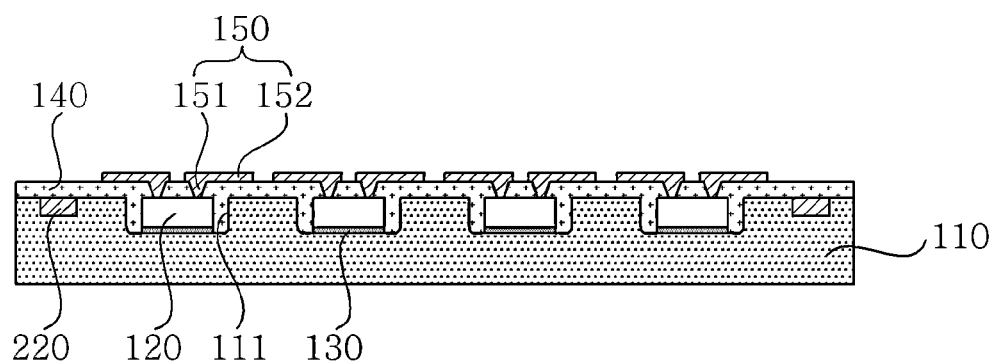

Referring to FIG. 15, a circuit layer 150 may be formed. The circuit layer 150 may be electrically connected with the device 120. The circuit layer 150 may include vias 151 and connection pads 152. The via holes may be formed in the insulating member 140 to expose upper portions of the devices 120. The via holes may be formed by a general via hole processing method, such as, exposing, laser processing, drill processing, or processing by chemicals. Here, the exposed upper portions of the devices 120 may be electrodes or the like, which an electric signal is inputted to or outputted from. After the via holes are formed, the vias 151 may be formed by filling the via holes with a conductive material. In addition, the connection pads 152 may be formed on the insulating member 140 such that the connection pads 152 are electrically connected with the vias 151. The connection pads 152 may also be formed of an insulating material. The vias 151 and the connection pads 152 may be formed by a general circuit forming method, such as, sputtering, electroless plating, electroplating, paste coating, or the like. The devices 120 and the connection pads 152 may be electrically connected with each other by the vias 151 formed as above.

Figure 16:
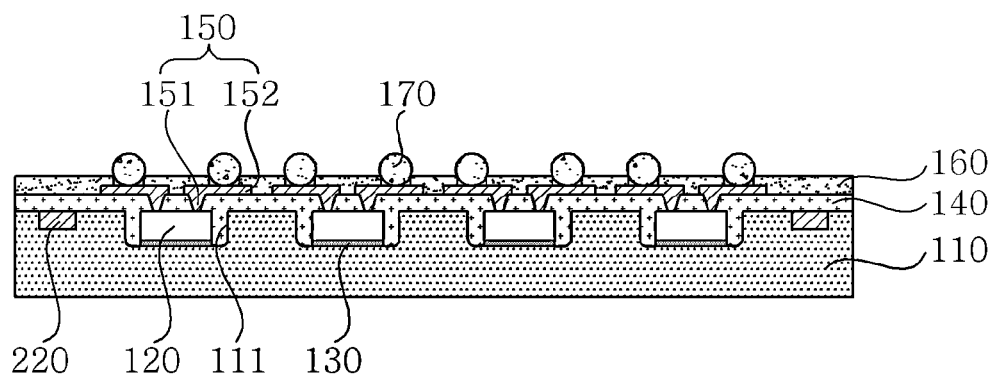

Referring to FIG. 16, a solder resist layer 160 and external connectors 170 may be formed. The solder resist layer 160 may be formed on the insulating member 140 and the circuit layer 150. Here, the solder resist layer 160 may include openings 161 for exposing upper portions of the connection pads 152. After the solder resist layer 160 is formed, the external connectors 170 may be formed on the upper portions of the connection pads 152, which are exposed through the openings 161. In addition, the external connectors 170 may be electrically connected with the external equipment (not shown) such as a surface mount component. Here, the external connector 170 may be a solder ball or the like. Although not shown in the preferred embodiment of the present invention, a surface treatment layer may be formed on the connection pads 152. The surface treatment layer may include at least one of gold (Au), OSP, palladium (Pd), and nickel (Ni).

Figure 17:
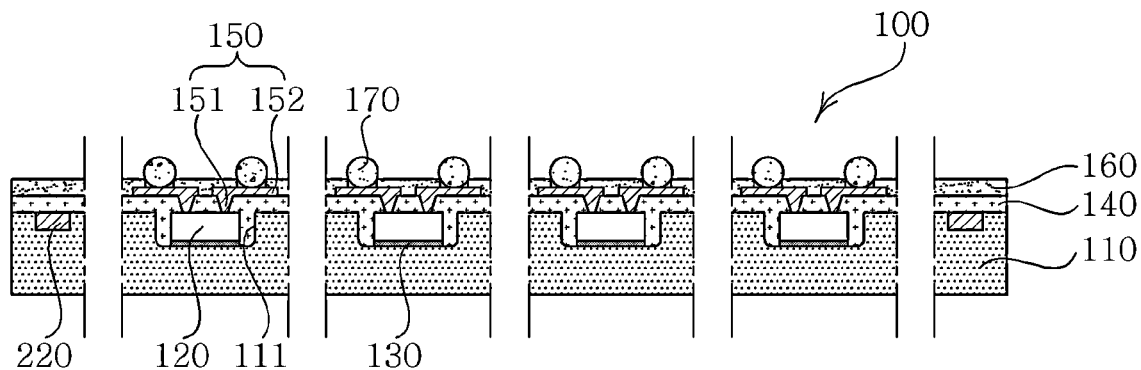

Referring to FIG. 17, unit-level semiconductor packages 100 may be separated from each other by cutting between the devices 120 mounted in the cavities 111. The preferred embodiment of the present invention may include a process of separating unit-level semiconductor packages 100 from each other since a plurality of devices 120 are simultaneously packaged. However, in the case where one device 120 is packaged, the process of separating unit-level semiconductor packages 100 from each other may be skipped.

According to the preferred embodiment of the present invention, the fiducial mark 220 or the pattern 230 for a fiducial mark insertion groove may be formed, but the present invention is not limited thereto. That is, a process of forming the fiducial mark 220 and the pattern 230 for a fiducial mark insertion groove may be skipped by those skilled in the art.

Figure 18:
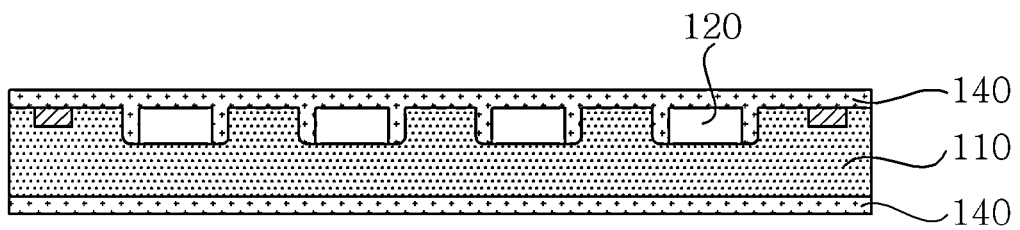
FIGS. 18 to 20 are exemplified views showing a method of manufacturing a semiconductor package according to another preferred embodiment of the present invention.
Figure 19:
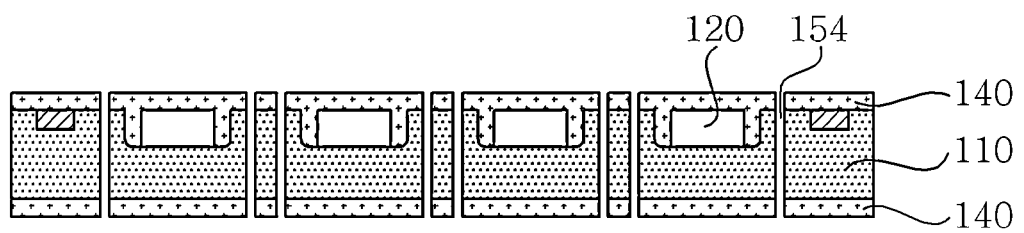
Figure 20:
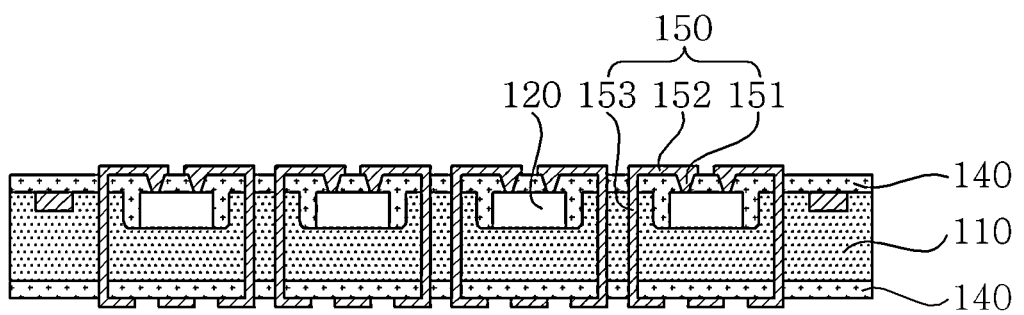

FIGS. 18 to 20 are exemplified views showing a method of manufacturing a semiconductor package according to another preferred embodiment of the present invention.

Referring to FIG. 18, an insulating member 140 may be formed on and beneath the molding member 110 in which the devices 120 are mounted. The insulating member 140 may fill the separation space between the cavity 111 and the device 120 mounted in the cavity 111. In addition, the insulating member 140 may be formed on the molding member 110 and the devices 120. In addition, the insulating member 140 may be formed beneath the molding member 110. The insulating member 140 may be formed of an insulating material, such as, polyimide, resin, photo resist, prepreg, or the like. The cavity 111 is larger than the device 120, so that the separation space is formed therebetween, and the insulating member 140 may fill the separation space. As such, the insulating member 140 formed in the separation space may buffer impact applied from the outside, to thereby serve to protect the device 120 mounted in the cavity 111 from the impact.

Referring to FIG. 19, penetration via holes 154 may be formed. The penetration via holes 154 may penetrate through the molding member 110 and the insulating member 140 formed on and beneath the molding member 110. The penetration via holes 154 may be formed by a general via hole processing method, such as, exposing, laser processing, drill processing, or processing by chemicals.

Referring to FIG. 20, a circuit layer 150 may be formed on the insulating member 140 formed on and beneath the molding member 110. The circuit layer 150 may be electrically connected with the device 120. The circuit layer 150 may include vias 151, connection pads 152, and penetration vias 153. The via holes may be formed in the insulating member 140 to expose upper portions of the devices 120. The via holes may be formed by a general via hole processing method, such as, exposing, laser processing, drill processing, or processing by chemicals. Here, the exposed upper portions of the devices 120 may be electrodes or the like, which an electric signal is inputted to or outputted from. After the via holes are formed, the vias 151 may be formed by filling the via holes with a conductive material. In addition, the connection pads 152 may be formed on the insulating member 140 such that the connection pads 152 are electrically connected with the vias 151. The connection pads 152 may also be formed of an insulating material. That is, the devices 120 and the connection pads 152 may be electrically connected with each other by the vias 151 formed as above. In addition, the penetration vias 153 may be formed by filling the penetration via holes 154 with a conductive material. Here, the penetration vias 153 may be formed by fill plating, to thereby fill all of the penetration via holes 154. Here, the penetration vias 153 may be formed by non-fill plating, to thereby plate only inner walls of the penetration via holes 154. The penetration vias 153 may electrically connect the circuit layer 150 formed above the molding member 110 and the circuit layer 150 formed under the molding member to each other. The vias 151, the connection pads 152, and the penetration vias 153 may be formed by a general circuit forming method, such as, sputtering, electroless plating, electroplating, paste coating, or the like.

Although the present invention exemplifies that the circuit layer 150 is formed in a single layer, the present invention is not limited thereto. That is, the circuit layer 150 and the insulating member 140 may be stacked in plural layers, and thus, may be formed in a multilayer structure.

After a single layer or a multilayer of circuit layer 150 is formed, a solder resist layer and external connectors may be formed and then a process of separating unit-level semiconductor packages from each other may be carried out, as shown in FIGS. 8 and 9, or 16 and 17.

FIGS. 21 to 24 are exemplified views showing a method of manufacturing a semiconductor package according to still another preferred embodiment of the present invention.

Figure 21:
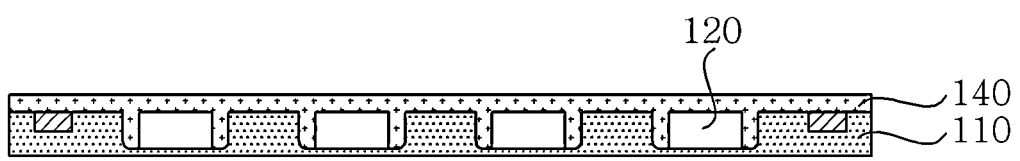
FIGS. 21 to 24 are exemplified views showing a method of manufacturing a semiconductor package according to still another preferred embodiment of the present invention.

Referring to FIG. 21, a polishing process may be performed on a lower portion of the molding member 110. First, a molding member 110 in which devices 120 are mounted and on which an insulating member 140 is formed may be provided according to a preferred embodiment of the present invention. A method of forming the insulating member 140 after the devices 120 are mounted in the molding member 110 may be confirmed through FIGS. 2 to 6 or 10 to 14. Here, a polishing process may be further performed on the lower portion of the molding member 110.

The thickness of the molding member 110 may be decreased by the polishing process performed on the lower portion of the molding member 110. For example, the molding member 110 may be polished such that lower surfaces of the devices 120 mounted in the cavities 111 are exposed. The molding member 110 is processed such that the surfaces of the devices are exposed in the preferred embodiment of the present invention, but is not limited thereto. That is, since the polishing process is for decreasing the thickness of the molding member 110, the thickness of the molding member 110 may be changed by those skilled in the art.

The polishing process performed on the lower portion of the molding member 110 may be carried out after the devices 120 are mounted in the molding member 110. After the polishing process is performed on the lower portion of the molding member 110, the insulating member 140 may be formed on the molding member 110 and the devices 120.

In addition, the polishing process performed on the lower portion of the molding member 110 may be carried out after the insulating member 140 is formed. First, the devices 120 may be mounted in the molding member 110. The insulating member 140 may be formed on the molding member 110 in which the devices 120 are mounted. As such, the insulating member 140 is formed on the molding member and the devices 120, and then the polishing process may be performed on the lower portion of the molding member 110.

Figure 22:
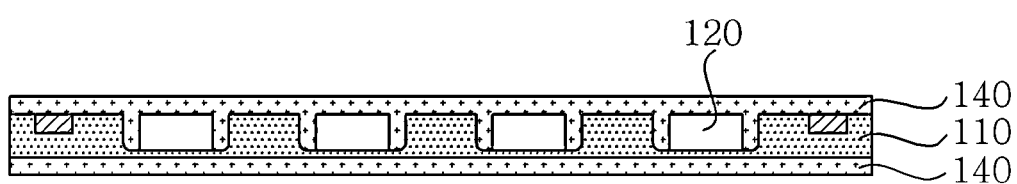

Referring to FIG. 22, the insulating member 140 may be formed on an upper portion of the molding member 110 in which the devices 120 are mounted and a lower portion of the molding member 110, which is polished. The insulating member 140 may be filled on and beneath the molding member 110 and also the separation space between the cavity 111 and the device 120 mounted in the cavity 111. The insulating member 140 may be formed of an insulating material, such as, polyimide, resin, photo resist, prepreg, or the like. The cavity 111 is larger than the device 120, so that the separation space is formed therebetween, and the insulating member 140 may fill the separation space. As such, the insulating member 140 formed in the separation space may buffer impact applied from the outside, to thereby serve to protect the device 120 mounted in the cavity 111 from the impact.

Figure 23:
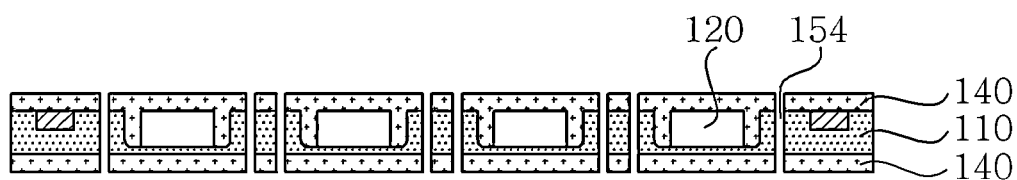

Referring to FIG. 23, penetration via holes 154 may be formed. The penetration via holes 154 may penetrate through the molding member 110 and the insulating member 140 formed on and beneath the molding member 110. The penetration via holes 154 may be formed by a general via hole processing method, such as, exposing, laser processing, drill processing, or processing by chemicals.

Figure 24:
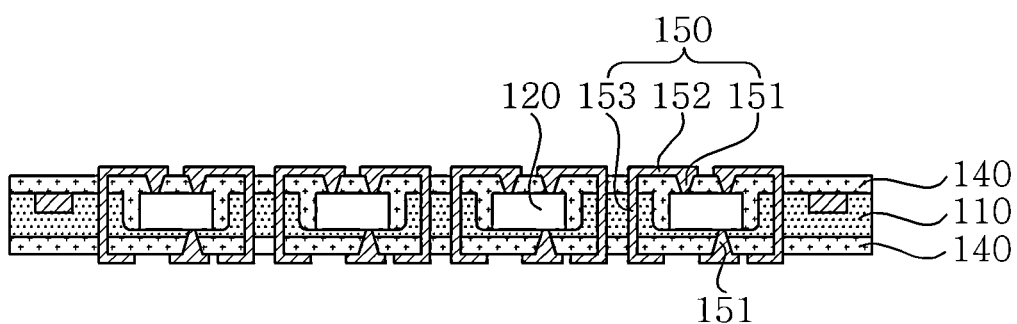

Referring to FIG. 24, a circuit layer 150 may be formed on the insulating member 140 formed on and beneath the molding member 110. The circuit layer 150 may be electrically connected with the device 120. The circuit layer 150 may include vias 151, connection pads 152, and penetration vias 153. Via holes may be formed in the insulating member 140 such that upper and lower portions of the devices 120 are exposed. The via holes may be formed by a general via hole processing method, such as, exposing, laser processing, drill processing, or processing by chemicals. Here, the exposed upper and lower portions of the devices 120 may be electrodes or the like, which an electric signal is inputted to or outputted from. After the via holes are formed, the vias 151 may be formed by filling the via holes with a conductive material. In addition, the connection pads 152 may be formed on the insulating member 140 such that the connection pads 152 are electrically connected with the vias 151. The connection pads 152 may be also formed of an insulating material. That is, the devices 120 and the connection pads 152 may be electrically connected with each other by the vias 151 formed as above. In addition, the penetration vias 153 may be formed by filling the penetration via holes 154 with a conductive material. Here, the penetration vias 153 may be formed by fill plating, to thereby fill all of the penetration via holes 154. Here, the penetration vias 153 may be formed by non-fill plating, to thereby plate only inner walls of the penetration via holes 154. The penetration vias 153 may electrically connect the circuit layers 150 formed above the molding member 110 and the circuit layer 150 formed under the molding member to each other. The vias 151, the connection pads 152, and the penetration vias 153 may be formed by a general circuit forming method, such as, sputtering, electroless plating, electroplating, paste coating, or the like.

Although the present invention exemplifies that the circuit layer 150 is formed in a single layer, the present invention is not limited thereto. That is, the circuit layer 150 and the insulating member 140 may be stacked in plural layers, and thus, may be formed in a multilayer structure.

As such, after a single layer or a multilayer of circuit layer 150 is formed, a solder resist layer and external connectors may be formed and then a process of separating unit-level semiconductor packages from each other may be carried out, as shown in FIGS. 8 and 9, or 16 and 17.

When the lower portion of the molding member 110 is polished as described in the preferred embodiment of the present invention, the thickness of the semiconductor package may be decreased.

In addition, after the surfaces of the devices 120 are exposed by polishing the lower portion of the molding member 110, a circuit layer 150 is formed under the molding member 110, and thus, it is possible to package the device 120 having an electrode formed therebeneath. Here, the device 120 may be any one of an active device having an electrode formed on one surface thereof and a passive device having electrodes formed on both surfaces thereof.

In the semiconductor package and the method of manufacturing the same according to the preferred embodiment of the present invention, the device can be protected from physical impact applied from the outside by forming the cavity to be larger than the device and forming the insulating member in the cavity. In addition, in the semiconductor package and the method of manufacturing the same according to the preferred embodiment of the present invention, the warpage phenomenon generated due to a difference of thermal expansion between the device and the molding member can be prevented by curing the molding member before the device is mounted in the molding member. In addition, in the semiconductor package and the method of manufacturing the same according to the preferred embodiment of the present invention, the thickness of the semiconductor package can be decreased by polishing the lower portion of the molding member. In addition, in the semiconductor package and the method of manufacturing the same according to the preferred embodiment of the present invention, the device having electrodes formed on both surfaces thereof can be packaged.

As set forth above, in the semiconductor package and the method of manufacturing the same according to the preferred embodiment of the present invention, the warpage phenomenon generated due to a difference of thermal expansion between the device and the molding member can be prevented by curing the molding member before the device is mounted in the molding member.

Further, in the semiconductor package and the method of manufacturing the same according to the preferred embodiment of the present invention, the cavity is larger than the device and the insulating member is formed in the cavity, so that the device can be protected from physical impact applied from the outside.

Further, in the semiconductor package and the method of manufacturing the same according to the preferred embodiment of the present invention, the thickness of the semiconductor package can be decreased by polishing the lower portion of the molding member.

Further, in the semiconductor package and the method of manufacturing the same according to the preferred embodiment of the present invention, the device having electrodes formed on both surfaces thereof can be packaged.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A semiconductor package, comprising:
   a molding member having a cavity;
   a device mounted in the cavity;
   an insulating member formed inside the cavity and on and/or beneath the molding member and the device;
   a circuit layer formed on the insulating member, and including vias and connection pads electrically connected with the device;
   a solder resist layer formed on the circuit layer, and having openings exposing upper portions of the connection pads; and
   solder balls formed in the openings,
   wherein the molding member is formed as Epoxy Molding Compound, and the insulating member formed in a space between the device and the cavity, the insulting member formed on an upper part of the molding member and the insulating member formed on an upper part of the device are integrally formed.

2. The semiconductor package as set forth in claim 1, wherein the cavity has a larger width than the device.

3. The semiconductor package as set forth in claim 1, wherein the cavity has a higher height than the device.

4. The semiconductor package as set forth in claim 1, further comprising an adhesive coated on a lower surface of the device.

5. The semiconductor package as set forth in claim 1, wherein the molding member has the cavity and is formed of an Epoxy Molding Compound.

6. The semiconductor package as set forth in claim 1, wherein an adhesive is formed only between a lower surface of the device and the molding member.

7. The semiconductor package as set forth in claim 1, wherein the device and the via are directly connected.

8. The semiconductor package as set forth in claim 1, wherein the insulating member is polyimide or photoresist.

* * * * *